(12) United States Patent
Fitzsimmons et al.

(10) Patent No.: US 7,015,580 B2
(45) Date of Patent: Mar. 21, 2006

(54) ROUGHENED BONDING PAD AND BONDING WIRE SURFACES FOR LOW PRESSURE WIRE BONDING

(75) Inventors: John A. Fitzsimmons, Poughkeepsie, NY (US); Jeffrey P. Gambino, Westford, VT (US); Erick G. Walton, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/722,704

(22) Filed: Nov. 25, 2003

(65) Prior Publication Data

US 2005/0112861 A1 May 26, 2005

(51) Int. Cl.
*H01L 23/48* (2006.01)
*H01L 23/52* (2006.01)
*H01L 29/40* (2006.01)

(52) U.S. Cl. .................. 257/739; 257/784; 257/786
(58) Field of Classification Search ............... 257/739, 257/784, 786
See application file for complete search history.

(56) References Cited

U.S. PATENT DOCUMENTS

| | | | | |
|---|---|---|---|---|
| 4,525,919 | A | | 7/1985 | Fabian ........................ 29/571 |
| 4,761,386 | A | * | 8/1988 | Buynoski ..................... 438/15 |
| 4,899,439 | A | | 2/1990 | Potter et al. .................. 29/846 |
| 5,487,999 | A | | 1/1996 | Farnworth ..................... 437/7 |
| 5,665,610 | A | * | 9/1997 | Nakata et al. ................ 438/18 |
| 5,686,762 | A | * | 11/1997 | Langley ...................... 257/775 |
| 5,736,791 | A | * | 4/1998 | Fujiki et al. ................ 257/781 |
| 5,870,822 | A | | 2/1999 | Drake et al. .................. 29/840 |
| 5,915,753 | A | | 6/1999 | Motomura et al. ............ 29/830 |
| 6,242,813 | B1 | * | 6/2001 | Huang et al. ............... 257/784 |
| 6,245,445 | B1 | * | 6/2001 | Lykins, II .................... 428/626 |
| 6,285,201 | B1 | * | 9/2001 | Farnworth et al. ........... 324/755 |
| 6,329,722 | B1 | * | 12/2001 | Shih et al. ................... 257/786 |
| 6,427,323 | B1 | | 8/2002 | Appelt et al. ................. 29/830 |
| 6,444,295 | B1 | * | 9/2002 | Peng et al. .................. 428/209 |
| 6,511,865 | B1 | * | 1/2003 | Lin ............................ 438/107 |
| 6,583,040 | B1 | | 6/2003 | Lin ............................ 438/612 |
| 6,642,731 | B1 | * | 11/2003 | Masuda ...................... 324/757 |
| 6,778,406 | B1 | * | 8/2004 | Eldridge et al. ............. 361/776 |
| 2002/0027289 | A1 | * | 3/2002 | Kurihara et al. ............ 257/765 |
| 2002/0084311 | A1 | * | 7/2002 | Barth ....................... 228/180.5 |

OTHER PUBLICATIONS

Patent Abstracts of Japan "Semiconductor Device and Its Manufacture", Hiroyuki et al. Publication No. 05-291331, English Translation.*
*Effect of Electroless Flash Copper Plate On Photoresist Adhesion to a Teflon® Sputtered Surface*, D. Canfield, K. Conrow, R. Edwards, C. Emmons, and J. McKeveny; IBM Technical Support, Oct. 16, 1990, pp. 1-14.

(Continued)

*Primary Examiner*—W. David Coleman
*Assistant Examiner*—Khiem Nguyen
(74) *Attorney, Agent, or Firm*—DeLio & Peterson, LLC; Kelly M. Nowak; Lisa U. Jaklitsch (57) ABSTRACT

An intermediate semiconductor structure and method for low-pressure wire bonding that reduces the propensity of dielectric material to mechanical failure due to any wire bonding stresses. Roughened surfaces such as metal pillars or metal dendrites are provided on a bonding pad, bonding wire or both. These roughened surfaces increase reactivity between the bond wire and the bond pad to form strong bonds. This increased activity as a result of the roughened bonding pad and/or wire surfaces reduce the amount of pressure, temperature and energy required for wire bonding, which in turn, avoids damage to the bonding pad as well as the semiconductor substrate.

13 Claims, 5 Drawing Sheets

OTHER PUBLICATIONS

*Growth Behavior of Evaporated Porous Thin Films*, D. Vick, T. Smy, M. J. Brett; Materials Research Society, J. Mater. Res., vol. 17, No. 11, Nov., 2002, pp. 29042911.

*Process Integration of Self-Assembled Polymer Templates Into Silicon Nanofabrication*, K. W. Guarini, C. T. Black, Y. Zhang, H. Kim, E. M. Sikorski, I. V. Babich; American Vacuum Society, J. Vac. Sci. Technol. B 20(6), Nov./Dec. 2002.

*Electrochemically Deposited Tin-Silver-Copper Ternary Solder Alloys*, Bioh Kim and Tom Ritzdorf; Journal of The Electrochemical Society, 150 (2) C53-C60 (2003).

*Morphology of Nanometer-Thick Electrolytic Copper Layers Investigated by Atomic Force Microscpy*, M. Cerisier, C. Van Haersendonck, J.-P. Celis; Journal of The Electrochemical Society, 146 (5) 1829-1834 (1999).

* cited by examiner

ROUGHENED BONDING PAD AND BONDING WIRE SURFACES FOR LOW PRESSURE WIRE BONDING

BACKGROUND OF THE INVENTION

1. Field of the Invention

The present invention relates to semiconductor substrates, and more particularly, to low-pressure wire bonding methods and apparatus that reduce the propensity of low-k dielectric materials of mechanical failure due to wire bonding stresses.

2. Description of Related Art

In semiconductor surface mount technology, integrated circuits (ICs) typically have one or more semiconductor-based circuits wired by metal interconnects, which in turn, have terminal inputs and outputs (I/O) to external circuitry. These ICs are often mounted on a mounting area of a lead frame having leads. Each I/O terminal is then connected to a lead by a thin bonding wire, which is typically made of gold or aluminum.

In making interconnections within an IC, each region of the semiconductor is provided with an electrode for connection with the bonding wire for connecting regions of the IC to each other. For those connections having an external lead, a bonding pad or electrode is typically prepared for making the desired interconnection. This is often accomplished by connecting a bonding wire to the electrode or bond pad by means of thermocompression or thermosonic bonding to form a small, rigid ball at the end of the bonding wire. This small ball is then pressed onto the electrode under high temperature while ultrasonically exciting the wire.

These conventional bonding techniques are often dependent upon a variety of processing conditions including, but not limited to, mechanical pressure, temperature, strength of the electrode or bond pad, power level of the added ultrasonic excitation, time, and so forth whereby any of such processing conditions can ultimately lead to semiconductor failure. For example, compression of the small, rigid ball at the end of the bonding wire often leads to structural damage and/or deformation of the substrate being compressed.

In order to address the foregoing problems, techniques have been directed to on-element bonding that includes bonding a thin metal wire via ultrasonic thermocompression. In so doing, an alloy region is formed to constitute a functional element, and then a thin metal wire is ultrasonically thermocompression-bonded to an electrode formed adjacent to such alloy region. However, this method of attaching wire bonding via thermocompression can undesirably result in forces that are capable of causing distortion, stress, and/or cracks in the pad, electrode or underlying substrate.

Further, wherein the substrate being processed includes a low-k dielectric material, it is commonly known that such materials have poor mechanical strength, and as such, are highly susceptible to damage and/or cracking during any conventional wire bonding technique. This is typically a result of the insertion of a wire bond being inserted with an excessive force during the bonding process, which leads to distortion, stress, and/or cracking of the bonding pad or any other underlying substrate material. In turn, any cracks, stresses and/or distortions in the bonding pad or any other underlying layer jeopardize the strength of the resultant bond and/or device reliability.

Since a reduction in the bond pressure during wire bonding would reduce the probability of cracks in the dielectric, and ultimately enhance reliability, a need continues to exist for improved wire bonding techniques for generating strong, reliable wire bonds while requiring less pressure, temperature, and energy than is accustomed in the prior art, and avoiding any distortion, stress, and/or cracking of the bonding pad and/or underlying substrate material.

SUMMARY OF THE INVENTION

Bearing in mind the problems and deficiencies of the prior art, it is therefore an object of the present invention to provide a method and intermediate structure for wire bonding that avoids creating any excessive force and power applied during the formation of the wire bond such that any distortion, stress, and/or cracking of the bonding pad and/or underlying substrate material is avoided.

It is another object of the present invention to provide a method and intermediate structure for wire bonding that generate strong, reliable wire bonds.

Another object of the present invention is to provide a method and intermediate structure for wire bonding that provide wire bonds without requiring any excessive force, temperature and energy applied during the formation of the wire bond.

A further object of the invention is to provide a method and intermediate structure for wire bonding that reduce wire bonding pressures, temperatures, and energy.

It is yet another object of the present invention to provide a method and intermediate structure for wire bonding that reduce micro cracks and other applied stresses to low-k dielectrics during wire bonding.

Yet another object of the invention is to provide a method and intermediate structure for wire bonding that reduce the propensity of dielectric material to have mechanical failure during wire bonding.

Still other objects and advantages of the invention will in part be obvious and will in part be apparent from the specification.

The above and other objects, which will be apparent to those skilled in art, are achieved in the present invention, which is directed to, in a first aspect, an intermediate structure of a semiconductor device for wire bonding. This intermediate structure includes a pad of the semiconductor device having an exposed surface and a wire for bonding to the pad. A roughened surface is on at least one of the exposed surface of the pad or a surface of the wire, whereby this roughened surface increases reactivity between the pad and the wire to prevent damage to the semiconductor device from the wire bonding.

The roughened surface may be finite metal structures selected from the group consisting of metal pillars and metal dendrites. Preferably, the roughness ranges from about 0.05 micron to about 10 micron.

In a second aspect, the invention also relates to an intermediate structure of a semiconductor device for wire bonding. The structure includes a pad of the semiconductor device having an exposed surface that has a first roughened surface on a portion thereof. The structure also includes a wire for bonding to the pad, whereby this wire has a second roughened surface on a portion of a surface thereof. These first and second roughened surfaces increase reactivity between the pad and the wire to prevent damage to the semiconductor device from the wire bonding.

In this aspect of the invention, the first and second roughened surfaces may be metal pillars of a bondable metal such as gold, aluminum or copper. The metal pillars may have a roughness ranging from about 0.05 micron to about 5 micron. The intermediate structure may further include each of the metal pillars having tips, wherein selected ones of the tips of metal pillars on the exposed surface of the pad directly contact the surface of the wire, while others of the tips of metal pillars on the surface of the wire directly contact the exposed surface of the pad.

Alternatively, the first and second roughened surfaces may be metal dendrites of a metal such as Pt, Pd, Au, Ag, Al, Sn, Cu, W, Ni, Cr, Co, In or Ga. The roughness of the metal dendrites ranges from about 1 micron to about 10 microns. Metal dendrites on opposing bonding pad and wire intermingle with each other.

In a third aspect, the invention is directed to a method for low-pressure wire bonding of a semiconductor device. The method includes providing a pad of the semiconductor device, a wire for bonding to the pad and a roughened surface on at least one of the pad or the wire. The roughened surface is then heated to a molten state to structurally modify the roughened surface and then the wire is bonded to the pad using this structurally modified roughened surface that increases reactivity between the pad and the wire to prevent damage to the semiconductor device from the wire bonding.

The roughened surface may be a finite structure selected from the group consisting of metal pillars and metal dendrites. These roughened surfaces may be deposited on both an exposed surface of the pad and a surface of the wire such that the roughened surface on the pad contacts a portion of the surface of the wire, while the roughened surface on the wire contacts a portion of the exposed surface of the pad. The roughened surfaces may be either or both metal pillars and/or metal dendrites that contact each other on surfaces of the pad and/or wire, or the roughened surfaces may be structures that entangle with each other and collapse upon and with themselves. The roughness of the roughened surface ranges from about 0.05 micron to about 10 micron.

Further, in this aspect of the invention, this method may further include applying pressures during the heating and bonding steps. In so doing, the roughened surface of the pad and/or wire represents an increase in surface area of the structure that allows for dispersing the pressures throughout this increased surface area to advantageously avoid a need for any excessive forces for the wire bonding. This, in turn, prevents damage to the semiconductor device undergoing processing in accordance with the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–3D of the drawings in which like numerals refer to like features of the invention.

Dielectrics have poor mechanical strength and are subject to cracking. Wire bonding to a semiconductor can induce cracks/damage in the dielectric when stresses are applied, which can ultimately lead to semiconductor failure. The present invention details a structure and method for low-pressure wire bonding to reduce the propensity of dielectric materials, particularly low-k dielectric materials, to mechanical failure.

In accordance with the invention, an approach is herein presented to increase the reactivity between the bond wire and the bond pad, which reduces the amount of pressure and ultrasonic and thermal energy required for wire bonding processing. In so doing, the invention discloses a roughened surface structure and methodology approach for low-pressure wire bonding to generate strong, reliable wire bonds.

In particular, the present invention is directed to providing at least one of a bonding pad or a bonding wire with a roughened surface for connecting the wire to the pad during wire bonding. Preferably, both a bonding pad and a bonding wire are provided with roughened surfaces for interconnection there-between.

An essential feature of the invention is that in making the wire bonding connection between the roughened surfaces, the invention avoids the need for any excessive force, temperature, and/or power applied during the formation of the wire bond. In the invention, it should be understood that excessive force is that amount of force which induces damage to the structure. That is, the invention advantageously reduces wire bonding pressures, temperatures, and energy, which in turn avoids any damage, including any distortion, stress, and/or cracking, to the bonding pad and/or underlying substrate.

Figure 1:
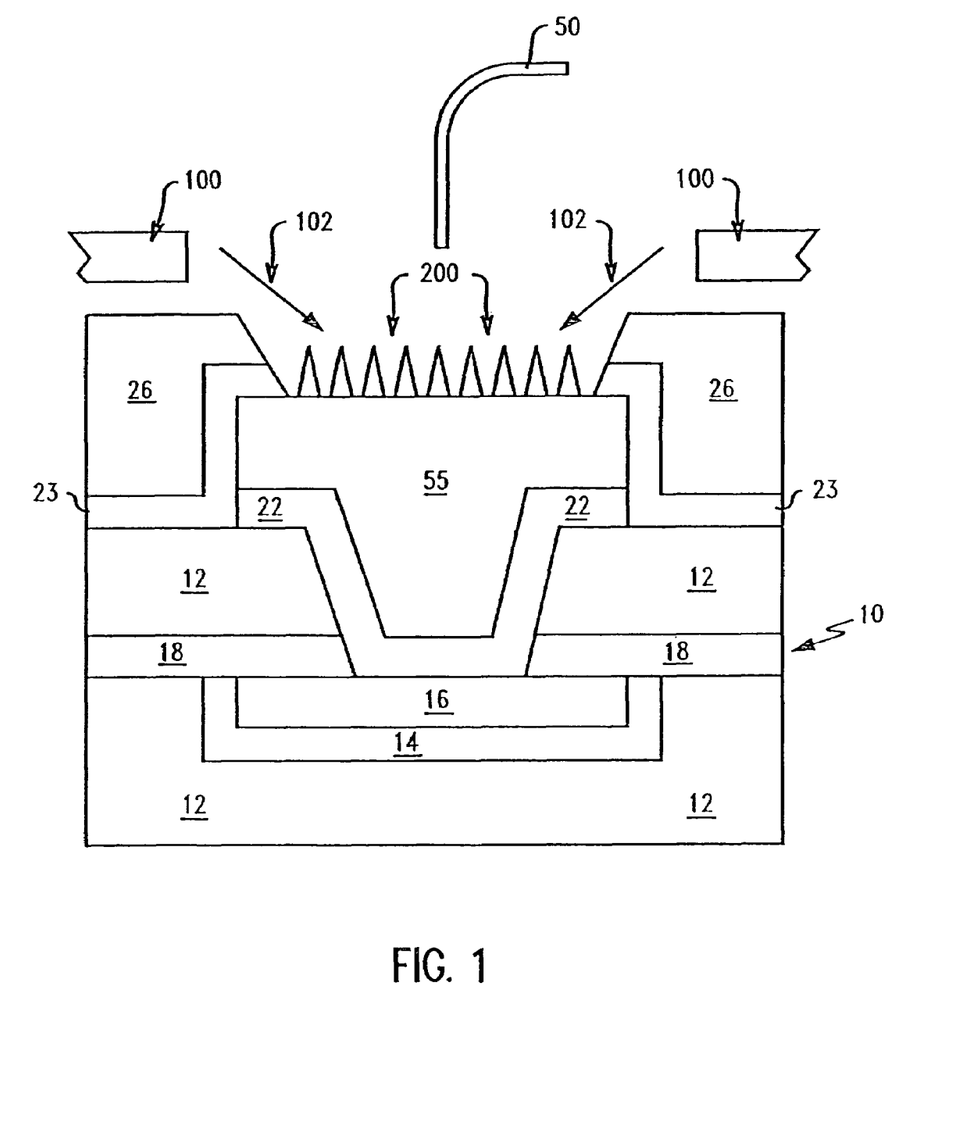
FIG. 1 is a cross-section of a semiconductor substrate depicting a roughened surface of a bonding pad thereof in accordance with the present invention.

For ease of understanding the invention, FIG. 1 depicts a semiconductor device 10 for processing in accordance with the invention. The semiconductor 10 includes a dielectric substrate 12 having an active interconnect region 16 that is separated from the substrate 12 via a barrier layer 14 and a diffusion barrier layer 18. The diffusion barrier layer 18 covers the interconnect region 16. For example, a $SiO_2$ substrate 12 may be separated from a copper interconnect 16 via a SiN barrier layer 14 and covered with a SiN barrier layer 18.

A portion of the SiN diffusion layer 18 is removed and a TaN/Ti/TiN liner 22 is deposited to cover and seal the exposed copper interconnect 16. A bonding via or pad 55 is then defined by known techniques and covered with a second barrier layer 23 followed by a polymer passivation layer 26, preferably of polyimide. The bonding pad 55 may be any known bonding pad material including, but not limited to, aluminum, copper, gold, and the like. For example, the pad or via may be an aluminum via 55 representing the bond pad to the copper interconnect 16.

A portion of the polyimide passivation layer 26 is removed at an angle such that an opening having angular sidewalls is formed in the polyimide layer, as well as in the second barrier layer 23 such that a portion of a surface of the aluminum bonding pad or via 55 is exposed for placement of a wire bond 50. This exposed surface is then used in accordance with the invention to increase the reactivity between the bond pad 55 and the bond wire 50, which reduces the amount of pressure and ultrasonic and thermal energy required for wire bonding processing.

In the preferred embodiment, both the exposed surface of the bond pad 55 and a portion of the surface area of the bond wire 50 for connection there-between are both provided with roughened surfaces for low-pressure wire bonding. However, it should be understood that as depicting in FIG. 1 only the bonding pad 55 may be provided with roughened surfaces. Alternatively, only the bonding wire 50 may be provided with roughened surfaces for connection in accordance with the invention.

The roughened surfaces of the invention are provided by forming finite structures of fine geometrical dimensions on the surfaces of the wires and/or pads such that the bonding wire and bonding pad are interconnected and bonded to each with minimal effort, temperature, energy and applied stresses or pressures. Preferably, the roughened surfaces are provided with a roughness, i.e., height or thickness, ranging from about 0.05 micron to about 10 micron. The roughened surfaces of the invention may include a variety of differing types of fine structures including, but not limited to, metal pillars, dendrites, and the like.

A crucial feature of the roughened surfaces is that the selected structure of the roughened surface is one that allows for an increase in the surface area of the bonding wire and/or bonding pad. This increase in surface area resulting from the roughened surfaces allows for dispersing pressures, forces or energies applied to the pad and wire, and hence underlying substrate, during wire bonding processing throughout the roughened surface structures, which in turn, minimizes the effort, temperature, energy and applied pressures required for wire bonding processing.

Figure 2A:
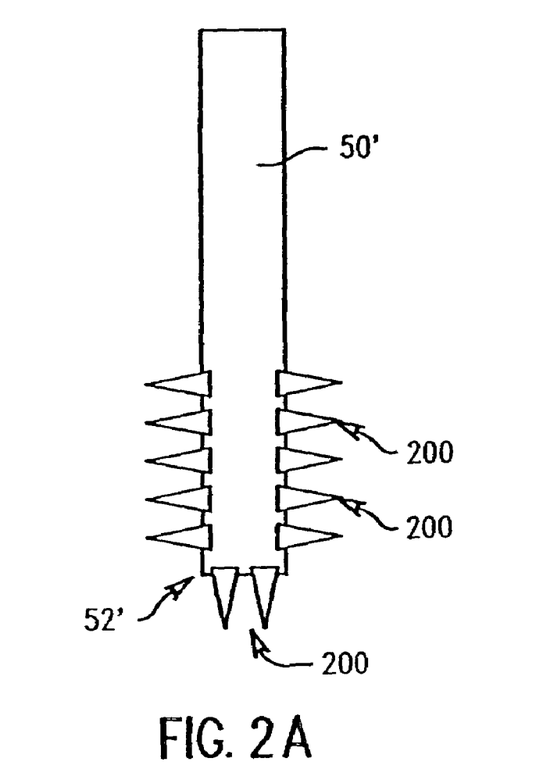
FIG. 2A is a cross-sectional view of a bonding wire having a roughened surface, particularly, of metal pillars.
Figure 2B:
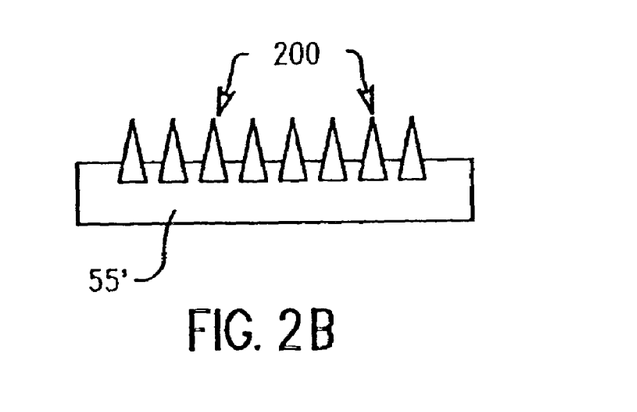
FIG. 2B is a cross-sectional view of a bonding pad having a roughened surface, particularly, of metal pillars.

Referring to FIGS. 2A–2B, bonding wire 50' and bonding pad 55' for use in wire bonding in accordance with the invention both have roughened surfaces consisting of metal pillars 200 on portions of surfaces thereof. The metal pillars may have a variety of different shapes including, but not limited to, conical, cylindrical, chevron, columns, helices and the like deposited by any deposition technique, such as, any conventional evaporation technique, sputtering technique, and the like. The metal pillars 200 may comprise a bondable metal such as gold, aluminum, copper or any other similar bondable metal that can be used to from metal pillars on the bond pad.

Preferably, the metal pillars 200 are deposited using glancing angle deposition techniques, such as via PVD, that use a shadow mask 100 to enable deposition of the pillars only to the desired locations or surface areas. For example, the pillars may be locally deposited only to the exposed surface area of the bonding pad 55' and/or to desired locations of the bonding wires 50'. In depositing the metal pillars onto the bonding wire 50', the pillars are preferably deposited only to an end 52' of the wire that is to be connected to the bonding pad 55' and a lower portion of such wire that is adjacent to end 52' as shown in FIG. 2A.

In glancing angle deposition, the metal is deposited at an angle of incidence using mask 100 to form pillars 200. The angle of incidence may range from about 45 degrees to about 89 degrees, preferably about 87 degrees. Preferably, the pillars 200 are conical in shape, as shown in FIGS. 2A–D, and are formed on the bonding pad by continuously rotating the substrate during the glancing angle deposition of the metal material. The roughness, i.e., height, of the roughened surfaces of pillars ranges from about 0.05 micron to about 5 micron, preferably 0.5 micron.

Pillars 200 may be formed by a localized plasma spray nozzle that is incorporated into the wire bonding tool. The deposition is preferably performed on the lower surface of the bonding wire, and/or on the lower surface of the "ball" at the tip of the wire that is to be connected to the bonding pad. Alternatively, the sides of the wires may be coated by using multiple plasma spray nozzles. Preferably, an angled plasma spray deposition may be used to enhance pillar formation on the bonding wire. The preferred materials for this plasma spray deposition onto the bonding wires for formation of pillars 200 are metals including, but not limited to, Au, Ag, Al, Sn, Cu, in addition to Ni, Cr, Co, In, Ga and the like.

Figure 2C:
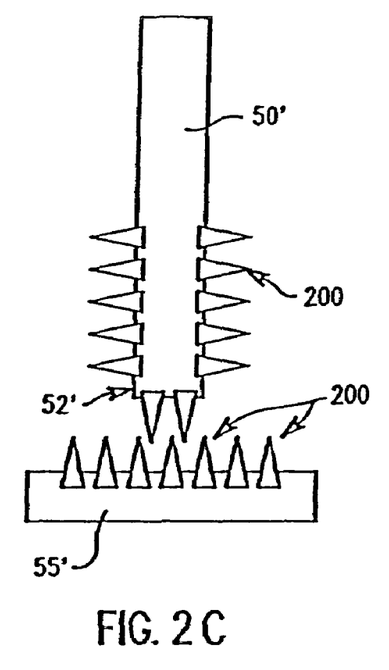
FIG. 2C is a cross-sectional view of the roughened bonding wire of FIG. 2A and the roughened bonding pad of FIG. 2B, both having roughened surfaces thereof, prior to wire bonding.
Figure 2D:
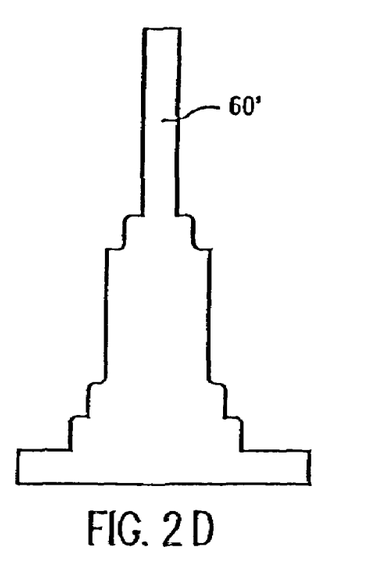
FIG. 2D is a cross-sectional schematic outline of the roughened bonding wire and roughened bonding pad of FIG. 2C subsequent to undergoing wire bonding in accordance with the invention.

The bonding wire 50' having metal pillars 200 (roughened surface) on an end 52' thereof and a lower portion of the wire adjacent such end 52' is then mated with the metal pillars 200 (roughened surface) on the surface of bonding pad 55' as shown by the intermediate structure prior to wire bonding of FIG. 2C. Wherein the roughened surfaces have the shape of conical pillars 200, a tip of each of such pillar on the end 52' of the wire 50' comes into direct contact with the bonding pad 55' as well as tips of selected ones of pillars 200 on the bonding pad coming into direct contact with end 52' of the wire 50'. The roughened wire and/or roughened pad are then pressed together under reduced pressure, temperature, and ultrasonic energy conditions for wire bonding, as compared to wires and pads not having roughened surfaces, whereby a strong bond between the wire and pad is formed without damaging or cracking any substrate layering. FIG. 2D depicts an outline of the resultant structure upon completion of bonding the wire 50' having a roughened surface of pillars 200 to the pad 55' also having a roughened surface pillars 200.

An essential feature is that by having only the tips of the roughened surface, i.e., pillars, coming into direct contact with the opposing bonding pad or wire, the energy required for wire bonding is concentrated at such tips in contact with the opposing pad or wire. As a result of this concentrated energy, the bonding of the wire to the pad is point focused to specific locations on the pad or wire such that melting or welding occurs significantly more rapidly and at lower temperatures, pressures and energies at these point specific locations, than those conventional bonding pads and/or wires not having roughened surfaces. As a result damage and cracking of the pad and substrate is significantly reduced, particularly for low k dielectric layers.

In the present invention, the combined features of the increase in surface area of the roughened surfaces and the concentrated energy at the tips of roughened surfaces contacting opposing surfaces of the bonding pad or bonding wire forms a stronger bond upon contact of the wire to the pad at lower temperature, pressure, and energy for wire bonding, as compared to wire bonding of conventional wires and pads not having roughened surfaces thereof. Again, by applying the highly focused force and pressure to a very small area, particularly tips of the roughened surfaces, the roughened surfaces of the wires and/or pads of the invention avoid distortions and cracks that the bonding pad and substrate would otherwise incur.

Figure 3A:
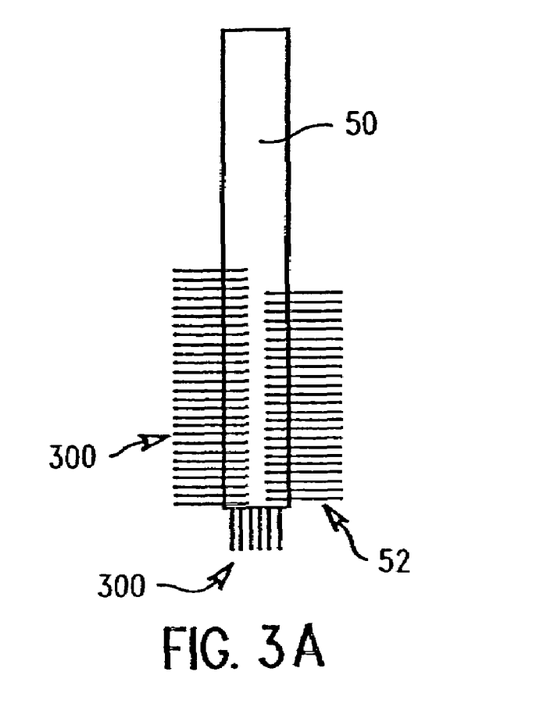
FIG. 3A is a cross-sectional view of a bonding wire having a roughened surface, particularly, of dendrite structures.
Figure 3B:
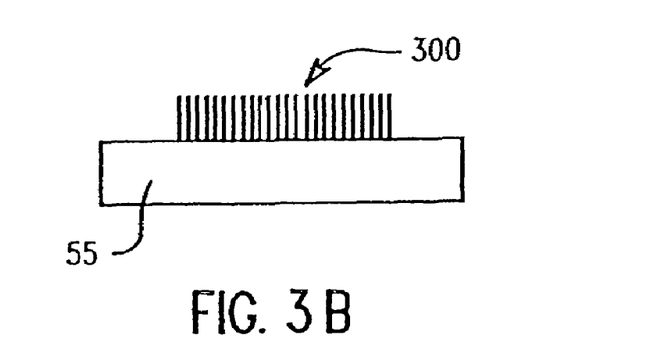
FIG. 3B is a cross-sectional view of a bonding pad having a roughened surface, particularly, of dendrite structures at a variety of angles with the parallel plane of the wire and/or bonding pad.
Figure 3C:
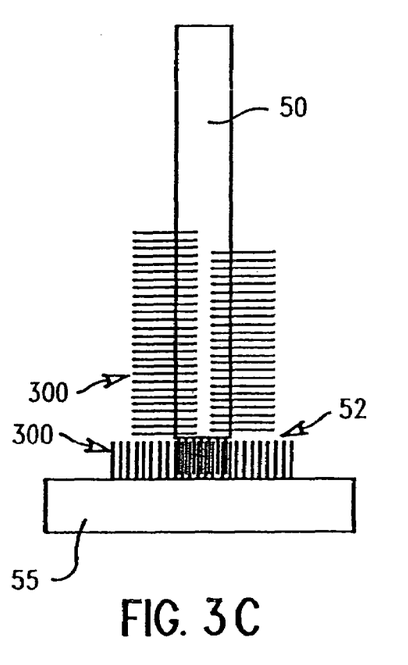
FIG. 3C is a cross-sectional view of the roughened bonding wire of FIG. 3A and the roughened bonding pad of FIG. 3B, both having roughened surfaces thereof, prior to wire bonding.

FIGS. 3A–3C show an alternate geometrical structure of the roughened surfaces of bonding wire 50 and bonding pad 55 in accordance with the invention. These roughened surfaces of wire 50 and pad 55 may be a metal growth or metal deposition that is capable of entangling with itself upon applied low pressure for collapsing and bonding wire 50 to pad 55.

For example, the roughened surfaces of bonding wire 50 and bonding pad 55 may comprise dendrite growth 300. Like the roughened surfaces of FIGS. 2A–D, dendrites 300 are provided on exposed surface areas of the bonding pad 55 and/or at the end 52 of wire 50 and a lower portion of wire 50 adjacent to such end 52. The dendrites 300 are preferably metallic dendrites of tiny branching structures that are formed when a molten metal, or an alloy of multiple molten metals, are allowed to solidify. The dendrites 300 on wire 50 and on pad 55 are grown so closely together that their branches intermingle with each other at end 52. FIGS. 3A–C show these dendrites at substantially 90 degree angles with a planar surface of the wire and/or bonding pad on which the dendrites are being formed. However, it should be understood that these dendrites 300 may be formed at any of a variety of a differing angles with respect to such planar surfaces.

The dendrites 300 may comprise a metal that is capable of alloying with materials of the bonding wire 50, or they may be a metal that is not capable of alloying. As such, dendrites 300 may comprise metals including, but not limited to, Pt, Pd, Au, Ag, Al, Sn, Cu, or alternatively, W, Ni, Cr, Co, In, Ga and the like. Dendrites 300 may be formed to a thickness or height ranging from about 1 micron to about 10 microns on both the bonding wire and the bonding pad. The roughened surface of dendrites also increase the mating surface area, which in turn, lowers the temperature, energy and pressure required for bonding, via this increased mating surface area, that may be further enhanced by alloys from the deposited dendrite growth.

The dendrites 300 may be provided on selected portions of surfaces of both the wire 50 and the pad 55 by deposition techniques, plating techniques, and the like. Other methods of providing the dendrites 300 include plating them onto surfaces of bond wire 50 and bond pad 55 using a low plating current density, such as at 10 mA/cm2, where the reaction is mass transfer limited. Electroless plating deposition of the dendrites onto the bonding pad and wire surfaces is the most preferred method of forming the dendrites as this technique allowing for selective deposition onto the bond pads and/or wires, as well as no requiring blanket seed layers.

Figure 3D:
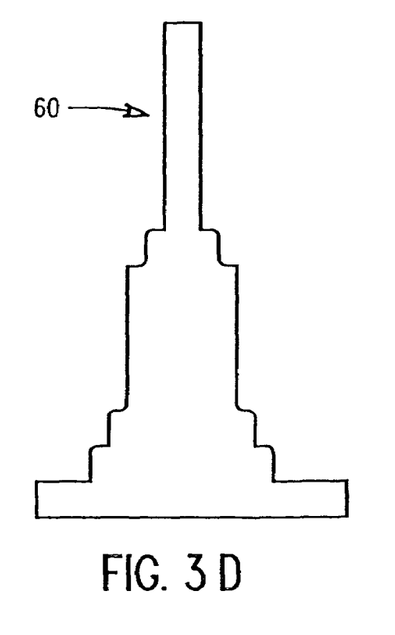
FIG. 3D is a cross-sectional schematic outline of the roughened bonding wire and roughened bonding pad of FIG. 3C subsequent to undergoing wire bonding in accordance with the invention.

Ultrasonic and thermal energy fuse the wire to the pad, both having roughened surfaces of dendrites as shown in FIG. 3D, whereby lower temperatures, energies, and pressures are needed for melting the dendrites into molten metal which results in wire bonding. Thus, as a result of the intermingling and energy enhancements of these reduced bulk mass dendritic structures, the bonding of the wire to the pad occurs more rapidly and under conditions of lower pressures, temperatures and energies to form a strong bond there-between, as compared to those bonding wires and pads not having dendrites on surfaces thereof. Again, as a result of these roughened surfaces of the wires and/or pads of the invention, distortions and cracks that the bonding pad and substrate that would otherwise occur are substantially avoided.

In sum, the present invention is directed to a wire bond structure that provides a stronger attachment between a bonding wire and a bonding pad, without introducing excessive force to the substrate during attachment, by providing roughened surfaces on at least one of the bonding wire or bonding pad, or alternatively, on both. The roughened surfaces of the bonding wire and/or bonding pad increase the reactivity between the bond wire and bond pad to allow a reduction in the temperature, energy and pressure required for wire bonding.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An intermediate structure of a semiconductor device for wire bonding comprising:
    a pad of said semiconductor device having a substantially planar exposed surface;
    a wire for bonding to said pad; and
    roughened structures provided on a surface of said wire for increasing reactivity between said pad and said wire to prevent damage to said semiconductor device from said wire bonding.

2. The intermediate structure of claim 1 wherein said roughened structures comprise finite metal structures selected from the group consisting of metal pillars and metal dendrites.

3. The intermediate structure of claim 1 wherein a roughness of said roughened structures ranges from about 0.05 micron to about 10 micron.

4. An intermediate structure of a semiconductor device for wire bonding comprising:
    a pad of said semiconductor device having a substantially planar exposed surface;
    first roughened structures provided on a portion of said exposed substantially planar surface of said pad;
    a wire for bonding to said pad; and
    second roughened structures provided on a portion of a surface of said wire, wherein said first and second roughened structures increase reactivity between said pad and said wire to prevent damage to said semiconductor device from said wire bonding.

5. The intermediate structure of claim 4 wherein said first and second roughened structures comprise metal pillars.

6. The intermediate structure of claim 5 wherein said metal pillars comprise a bondable metal selected from the group consisting of gold, aluminum and copper.

7. The intermediate structure of claim 5 wherein said metal pillars are provided with a roughness ranging from about 0.05 micron to about 5 micron.

8. The intermediate structure of claim 5 further including each of said metal pillars having tips, wherein selected ones of said tips of metal pillars on said exposed surface of said pad directly contact said surface of said wire, while others of said tips of metal pillars on said surface of said wire directly contact said exposed surface of said pad.

9. The intermediate structure of claim 4 wherein said first and second roughened structures comprise metal dendrites.

10. The intermediate structure of claim 9 wherein said metal dendrites comprise a metal selected from the group consisting of Pt, Pd, Au, Ag, Al, Sn, Cu, W, Ni, Cr, Co, In and Ga.

11. The intermediate structure of claim 9 wherein said metal dendrites are provided with a roughness ranging from about 1 micron to about 10 microns.

12. The intermediate structure of claim 9 wherein said metal dendrites on said exposed substantially planar surface of said pad and said metal dendrites on said surface of said wire intermingle with each other.

13. The intermediate structure of claim 5 wherein said metal pillars have a shape selected from the group consisting of conical, cylindrical, chevron, columns, and helices.

* * * * *